US012740168B2

(12) United States Patent
Lin

(10) Patent No.: US 12,740,168 B2
(45) Date of Patent: Sep. 15, 2026

(54) IMAGE SENSOR AND PACKAGING THEREOF

(71) Applicant: POWERTECH TECHNOLOGY INC., Hsinchu County (TW)

(72) Inventor: Ching-Chao Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 380 days.

(21) Appl. No.: 18/486,242

(22) Filed: Oct. 13, 2023

(65) Prior Publication Data

US 2024/0297190 A1 Sep. 5, 2024

(30) Foreign Application Priority Data

Mar. 1, 2023 (TW) ................................ 112107258

(51) Int. Cl.
*H10F 39/00* (2025.01)

(52) U.S. Cl.
CPC ......... *H10F 39/804* (2025.01); *H10F 39/811* (2025.01)

(58) Field of Classification Search
CPC ............................ H10F 39/804; H10F 39/811
See application file for complete search history.

(56) References Cited

U.S. PATENT DOCUMENTS

2009/0057912 A1* 3/2009 Kheng ............. H01L 23/49827 257/774
2014/0077366 A1* 3/2014 Kim ...................... H01L 21/561 257/737
2017/0117214 A1* 4/2017 Park .................. H01L 23/49827
2019/0189667 A1* 6/2019 Jung ...................... H10F 39/811
2019/0229139 A1* 7/2019 Lim ....................... H10F 39/026
2021/0296389 A1* 9/2021 Wang .................... H10F 39/026
2022/0165778 A1 5/2022 Kim et al.

FOREIGN PATENT DOCUMENTS

| | | | |
|---|---|---|---|
| CN | 104241300 | 12/2014 | |
| CN | 110752225 | 2/2020 | |
| KR | 20140148112 A | * 12/2014 | ............ H01L 25/18 |
| TW | 201929159 | 7/2019 | |
| TW | 202221877 | 6/2022 | |

* cited by examiner

*Primary Examiner* — Ratisha Mehta
*Assistant Examiner* — Sophia W Kao
(74) *Attorney, Agent, or Firm* — Birch, Stewart, Kolasch & Birch, LLP

(57) ABSTRACT

An image sensor includes an image sensing chip, an encapsulant, a plurality of outer-side encapsulant vias, an interior wire redistribution layer and an exterior wire redistribution layer. The encapsulant wraps around the image sensing chip, the outer-side encapsulant vias penetrate the encapsulant, and the interior wire redistribution layer is formed on a top surface of the encapsulant, wherein the image sensing chip is electrically connected to the exterior wire redistribution layer through the interior wire redistribution layer and the outer-side encapsulant vias, and then further through the conducting terminals on the exterior wire redistribution layer to connect to the outside. The exterior wire redistribution layer is directly formed underneath the image sensing chip without using a substrate. Since the electrical connection is realized through the outer-side encapsulant vias, the thicknesses of the encapsulant and the size of the packaged image sensor can be reduced.

10 Claims, 15 Drawing Sheets

IMAGE SENSOR AND PACKAGING THEREOF

CROSS REFERENCE TO RELATED APPLICATION(S)

This non-provisional application claims the benefit under 35 U.S.C. § 119(e) to patent application No. 112107258 filed in Taiwan on Mar. 1, 2023, which is hereby incorporated in its entirety by reference into the present application.

BACKGROUND OF THE INVENTION

1. Field of the Invention

The present invention relates to an image sensor, especially to an image sensor capable of reducing package size.

2. Description of the Related Art

Please refer to FIG. 7: a currently available image sensing module includes an image sensor 100, a circuit board 200, an optical lens holder 300 and a plurality of optical lenses 310. The image sensor 100 is electrically connected to the surface of the circuit board 200, and the optical lens holder 300 is also configured on the surface of the circuit board 200, so that the image sensor 100 is accommodated in an interior space 301 of the optical lens holder 300, and the plurality of optical lenses 310 are respectively assembled in the optical lens holder 300 and aligned with the image sensor 100.

The image sensor 100 is shown in FIG. 8. An image sensing chip 101 is configured on an upper surface of a substrate 102, a plurality of contact pads 103 of the image sensing chip 101 are electrically connected to the substrate 102 through conducting wires 104, and then an encapsulant 105 wraps around the image sensing chip 101 and the conducting wires 104.

In the currently available image sensor 100, the substrate 102 is an essential part for electrical connection of the image sensing chip 101, and hence a packaged product of the image sensing chip 101 should include the thickness of the substrate 102. In addition, the image sensing chip 100 is electrically connected to the substrate 102 through the conducting wires 104 having a certain line height h, and hence the encapsulant 105 should be thick enough to completely cover the conducting wires 104. As a result, an overall package size/thickness of the currently available image sensor 100 cannot be easily reduced.

When the image sensor 100 is configured in the interior space 301 of the optical lens holder 300 in FIG. 7, the interior space 301 must be large enough to accommodate the image sensor 100, thereby hindering the reduction of overall volume of the image sensor module.

SUMMARY OF THE INVENTION

The present invention provides an image sensor with reduced size of a package and reduced manufacturing costs, so that the image sensor can be more readily adopted in small-sized optical devices.

The image sensor of the present invention comprises:

an image sensing chip, including an active surface and a back surface facing each other, and the active surface having an image sensing region, and a plurality of contact pads located on a periphery of the image sensing region on the active surface;

an encapsulant, wrapping around the periphery of the image sensing chip without covering the image sensing region to expose the image sensing region;

a plurality of outer-side encapsulant vias, which penetrates the encapsulant and is located on the outer periphery of the image sensing chip, and an inner wall of each of the plurality of outer-side encapsulant vias has a conducting layer;

an interior wire redistribution layer covering a top surface of the encapsulant and electrically connecting the plurality of contact pads and the conducting layer of the plurality of outer-side encapsulant vias;

a dielectric layer covering the surface of the interior wire redistribution layer and the top surface of the encapsulant;

a transparent cover plate, attached to the top surface of the encapsulant through an adhesive layer, and separated from the image sensing region by a gap;

an exterior wire redistribution layer formed underneath the image sensing chip and a bottom surface of the encapsulant, and the exterior wire redistribution layer electrically connected to the conducting layer of the plurality of outer-side encapsulant vias; and a plurality of conducting terminals, electrically connected to the exterior wire redistribution layer.

The image sensing chip of the present invention is electrically connected to the exterior wire redistribution layer through the interior wire redistribution layer and the outer-side encapsulant vias; as a result, no additional wire bonding process is required, and as the image sensing chip does not need to be electrically connected to a substrate, but instead connects to an external circuit board through the exterior wire redistribution layer and the conducting terminals, thereby reducing the size of the image sensor.

BRIEF DESCRIPTION OF THE DRAWINGS

FIGS. 2A-2J are schematic diagrams of the manufacturing process of a first embodiment of the image sensor of the present invention;

DETAILED DESCRIPTION OF THE INVENTION

In the following, the technical solutions in the embodiments of the present invention will be clearly and fully described with reference to the drawings in the embodiments of the present invention. Obviously, the described embodiments are only a part of, not all of, the embodiments of the present invention. Based on the embodiments of the present invention, all other embodiments obtained by a person of ordinary skill in the art without creative efforts shall fall within the protection scope of the present invention.

Figure 1:
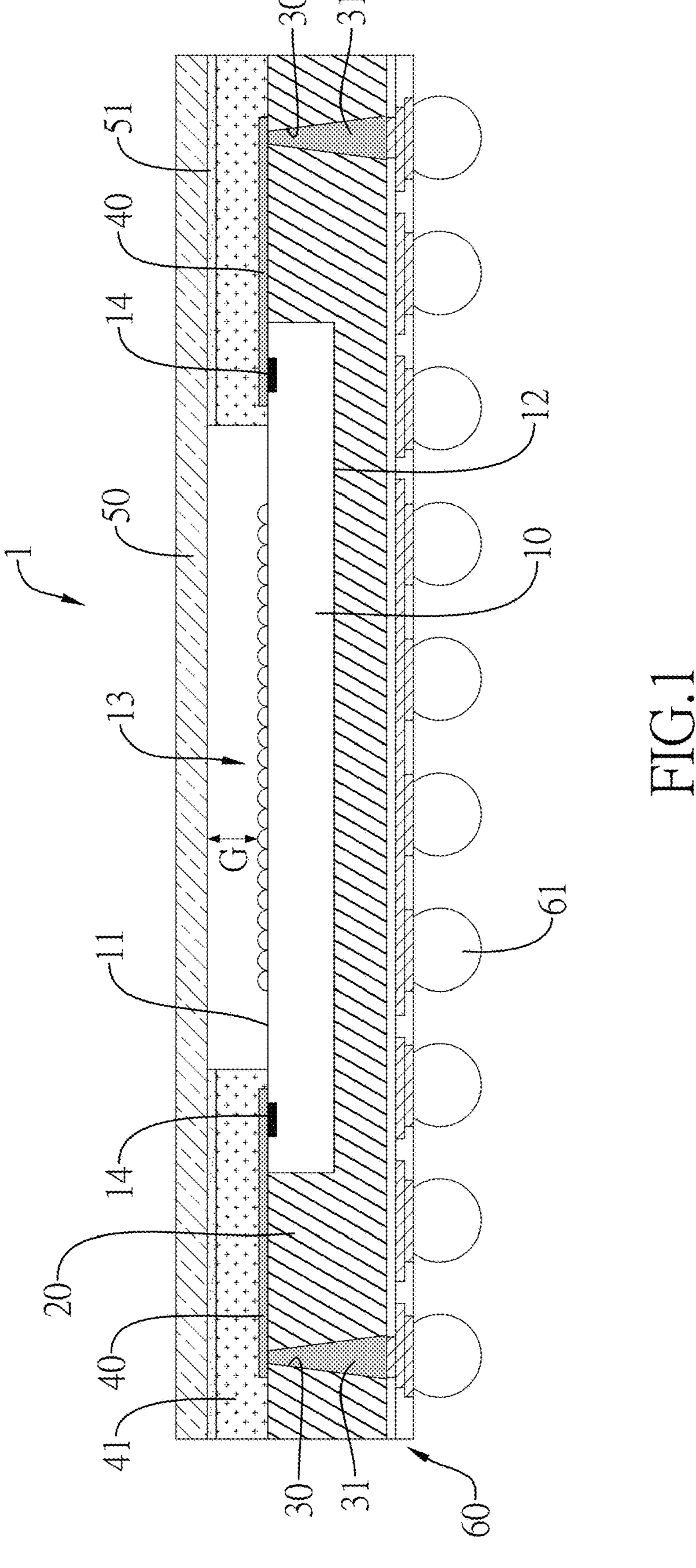
FIG. 1 is a schematic sectional view of the first embodiment of the image sensor of the present invention.

Please refer to FIG. 1: the first embodiment of the image sensor 1 of the present invention mainly includes an image sensing chip 10, an encapsulant 20, an interior wire redistribution layer 40, a transparent cover plate 50, and an exterior wire redistribution layer 60.

The image sensing chip 10 has an active surface 11 and a back surface 12 facing each other. On the active surface 11, there are an image sensing region 13 and a plurality of contact pads 14, and the plurality of contact pads 14 are located on the periphery of the image sensing region 13. The encapsulant 20 wraps around the periphery of the image sensing chip 10 and its back surface 12; but the image sensing region 13 is exposed without being covered by the encapsulant 20, and a top surface of the encapsulant 20 is flush with the active surface 11.

The encapsulant 20 has a plurality of outer-side encapsulant vias 30, and each of the plurality of outer-side encapsulant vias 30 penetrates the encapsulant 20 located at an outer periphery of the image sensing region 13. The aperture of each outer-side encapsulant via 30 is tapered from the back surface 12 to the active surface 11 of the image sensing chip 10, and there is a conducting layer 31 on the inner wall of each outer-side encapsulant via 30. In this embodiment, the conducting layer 31 is filled into each of the plurality of outer-side encapsulant vias 30.

The interior wire redistribution layer 40 is formed on the top surface of the encapsulant 20, and extends horizontally to cover the plurality of contact pads 14 of the image sensing chip 10, so that the plurality of contact pads 14 of the image sensing chip 10 is electrically connected to the conducting layer 31 in the plurality of outer-side encapsulant vias 30. A dielectric layer 41 covers the surface of the interior wire redistribution layer 40 and the top surface of the encapsulant 20, and the dielectric layer 41 also directly covers a periphery of the active surface 11 of the image sensing chip 10 to cover tops of the plurality of contact pads 14; nevertheless the active surface 11 of the image sensing chip 10 is exposed without being covered by the dielectric layer 41.

The transparent cover plate 50 covers the image sensing region 13 and is separated from the image sensing region 13 by a gap G. In this embodiment, the transparent cover plate 50 is attached on a top surface of the dielectric layer 41 through an adhesive layer 51. As the thickness of the adhesive layer 51 is thin, the height of the gap G can be regarded as equivalent to the thickness of the dielectric layer 41.

The exterior wire redistribution layer 60 is formed underneath the encapsulant 20 and is electrically connected to the conducting layer 31 in the outer-side encapsulant via 30. Specifically, the exterior wire redistribution layer 60 is formed entirely on the bottom surface of the encapsulant 20. A plurality of conducting terminals 61 are electrically connected to the exterior wire redistribution layer 60, and the conducting terminals 61 serve as contacts for the image sensing chip 10 to electrically connect to the outside. The conducting terminals 61 are electrically connected to the plurality of contact pads 14 through the exterior wire redistribution layer 60, the conducting layer 31 in the outer-side encapsulant via 30 and the interior wire redistribution layer 40.

FIG. 2A to FIG. 2J are schematic diagrams of the production process of the above-mentioned image sensor 1.

Figures 2A, 2B, 2C:
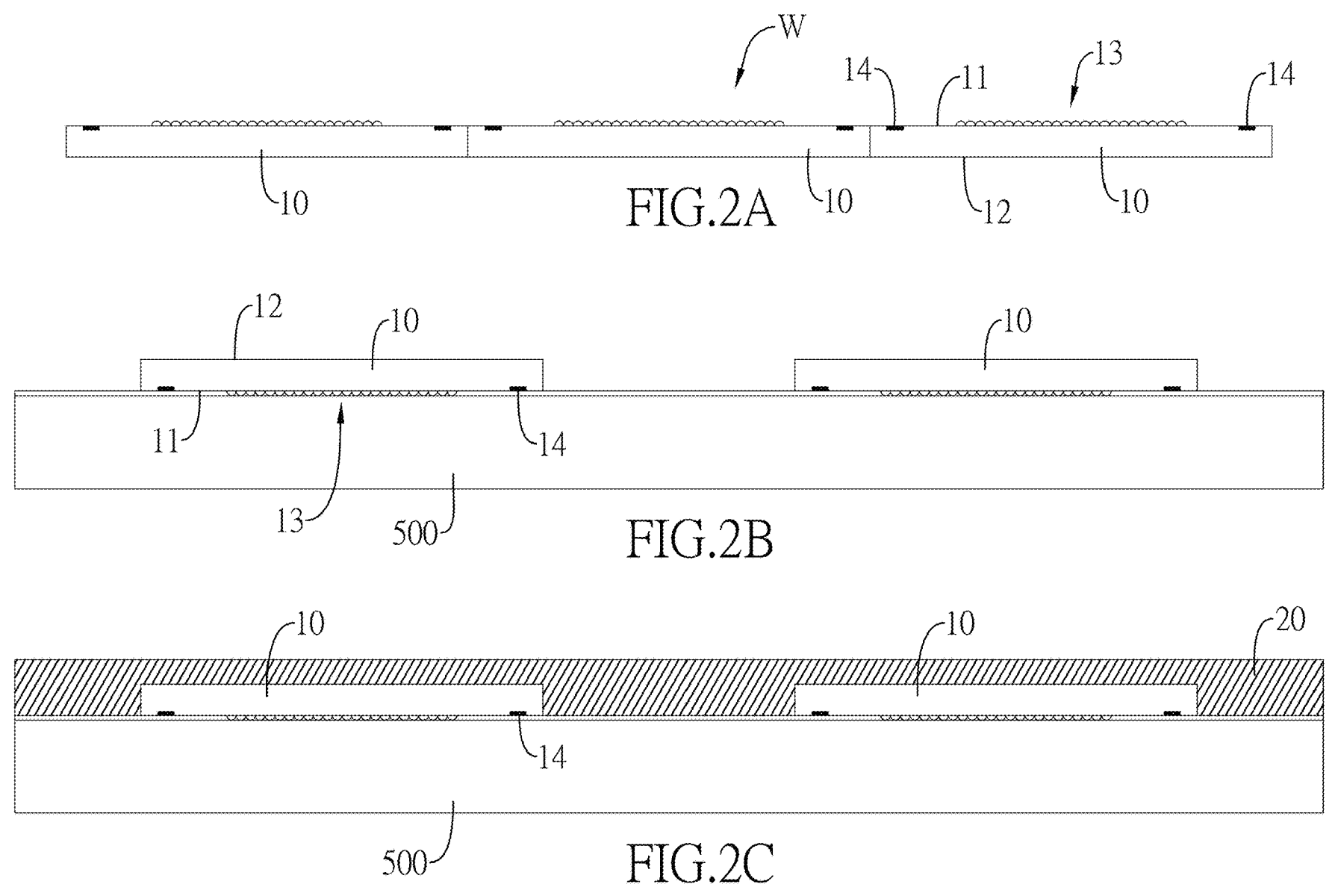

Please refer to FIG. 2A. First, a wafer W is provided. The wafer W has been manufactured with multiple image sensing chips 10, each image sensing chip 10 has an active surface 11 and a back surface 12 facing each other, and the active surface 11 has an image sensing region 13 and a plurality of contact pads 14 configured around the periphery of the image sensing region 13, the image sensing region 13 is used to detect optical signals or images, for example, the image sensing region 13 can have an image sensor array (e.g. CMOS Image Sensing (CIS) cell array) which is used to detect optical signals or images. The contact pads 14 serve as contacts for the image sensing chip 10 to be electrically connected to the outside. Cutting lines are reserved between adjacent image sensing chips 10, and multiple independent image sensing chips 10 can be obtained after cutting through the wafer W along these cutting lines.

Please refer to FIG. 2B: temporarily attach the active surface 11 of each image sensing chip 10 on a surface of a plate 500, make the back surface 12 of each image sensing chip 10 face up, and reserve enough spacing between adjacent image sensing chips 10 to facilitate subsequent encapsulation steps.

Please refer to FIG. 2C. An encapsulant 20 is formed to wrap around each image sensing chip 10 and to wrap the back surface 12 of each image sensing chip 10.

Figures 2D, 2E:
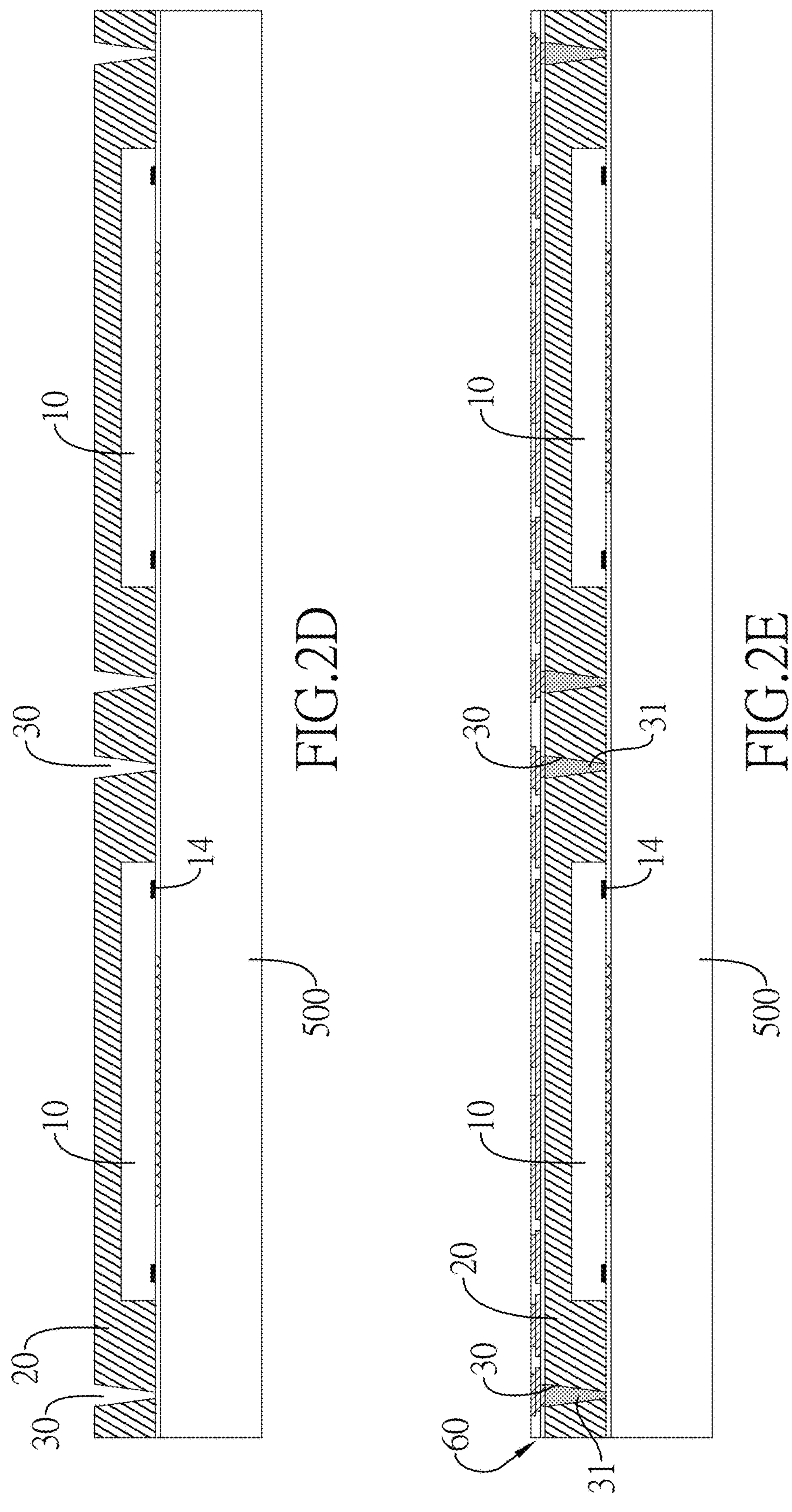

Please refer to FIG. 2D: the surface of the encapsulant 20 is drilled to obtain a plurality of outer-side encapsulant vias 30, and these outer-side encapsulant vias 30 are located on the outer periphery of the image sensing chip 10 and penetrate the encapsulant 20. In this embodiment, an aperture size of each outer-side encapsulant via 30 is tapered from the back surface 12 to the active surface 11 of the image sensing chip 10. In other embodiments, the encapsulant 20 can also be mechanically drilled with a drill bit to form the outer-side encapsulant vias 30.

Please refer to FIG. 2E. A conducting layer 31 is filled to cover on the inner wall of each outer-side encapsulant via 30, and an exterior wire redistribution layer 60 is formed on the surface of the encapsulant 20, and the exterior wire redistribution layer 60 is electrically connected to the conducting layer 31 in each outer-side encapsulant via 30. In this embodiment, the conducting layer 31 fills up an interior of the outer-side encapsulant via 30.

Figures 2F, 2G, 2H:
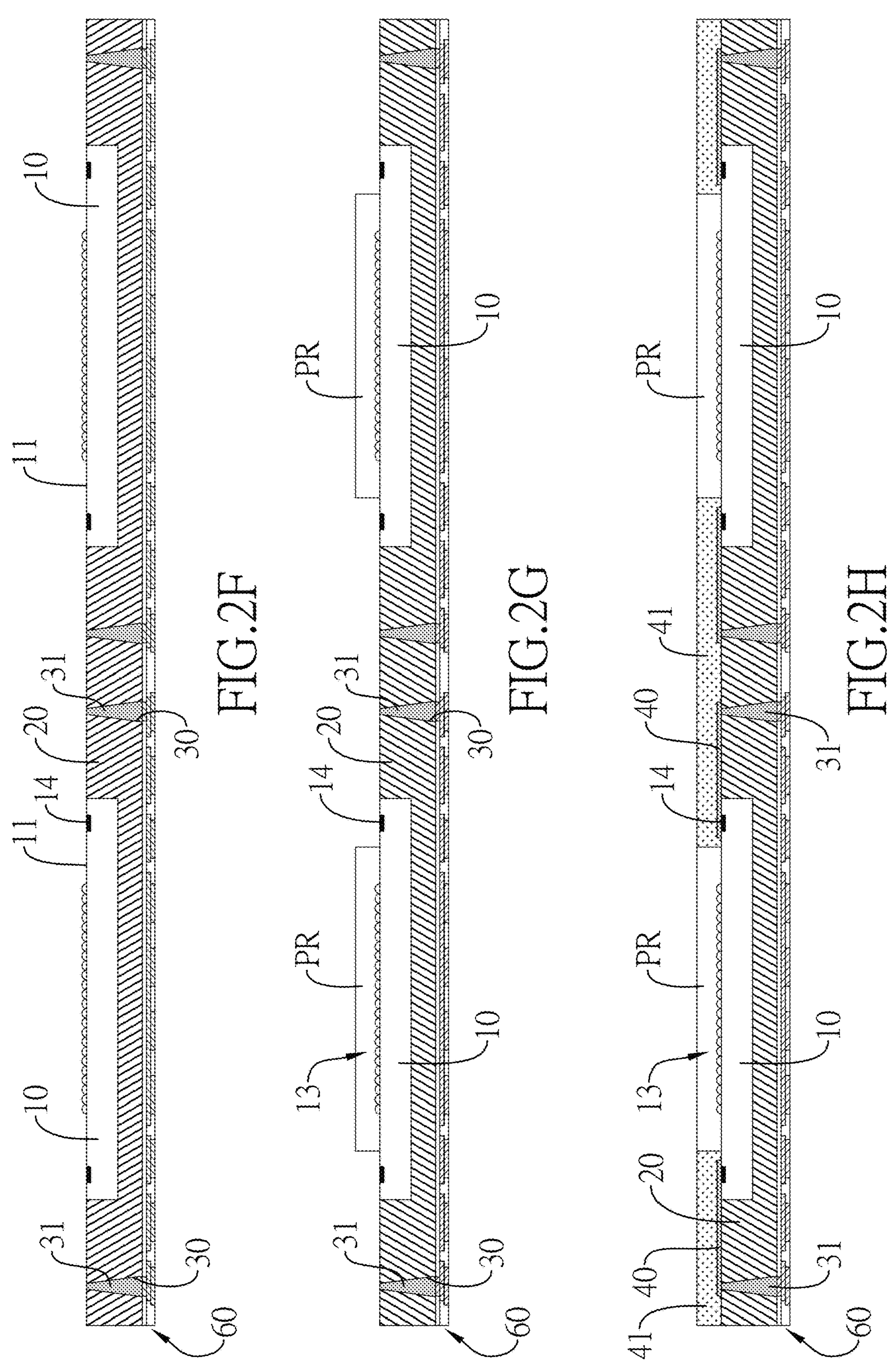

Please refer to FIG. 2F. After the exterior wire redistribution layer 60 is manufactured, the plate 500 is removed and the image sensing chip 10 is flipped to expose the active surface 11 and the top surface of the encapsulant 20 of each image sensing chip 10.

Please refer to FIG. 2G. A photoresist layer PR is covered on the image sensing region 13 of each image sensing chip 10. In this embodiment, the photoresist layer PR is a patterned photoresist layer formed by a yellow-light process to temporarily cover the image sensing region 13 to prevent subsequent processes from affecting or polluting the image sensing region 13. The photoresist layer PR entirely covers the image sensing region 13, except the contact pads 14.

Please refer to FIG. 2H. An interior wire redistribution layer (RDL) 40 is manufactured on the top surface of the encapsulant 20, and the interior wire redistribution layer 40 is electrically connected to the contact pads 14 and the conducting layer 31 in the outer-side encapsulant vias 30. In this way, the contact pads 14 can be electrically connected to the exterior wire redistribution layer 60 through the interior wire redistribution layer 40. A dielectric layer 41 is further formed on the top surface of the encapsulant 20, and the dielectric layer 41 covers the surface of the interior wire redistribution layer 40 to prevent the interior wire redistribution layer 40 from being polluted, oxidized or damaged, wherein the dielectric layer 41 covers the part of the active surface 11 located on the contact pads 14, and the top surface of the dielectric layer 41 is flush with the surface of the photoresist layer PR. Since the surface of each image sensing region 13 is covered and protected by the photoresist layer PR, the dielectric layer 41 does not enter each image sensing region 13.

Figures 2I, 2J:
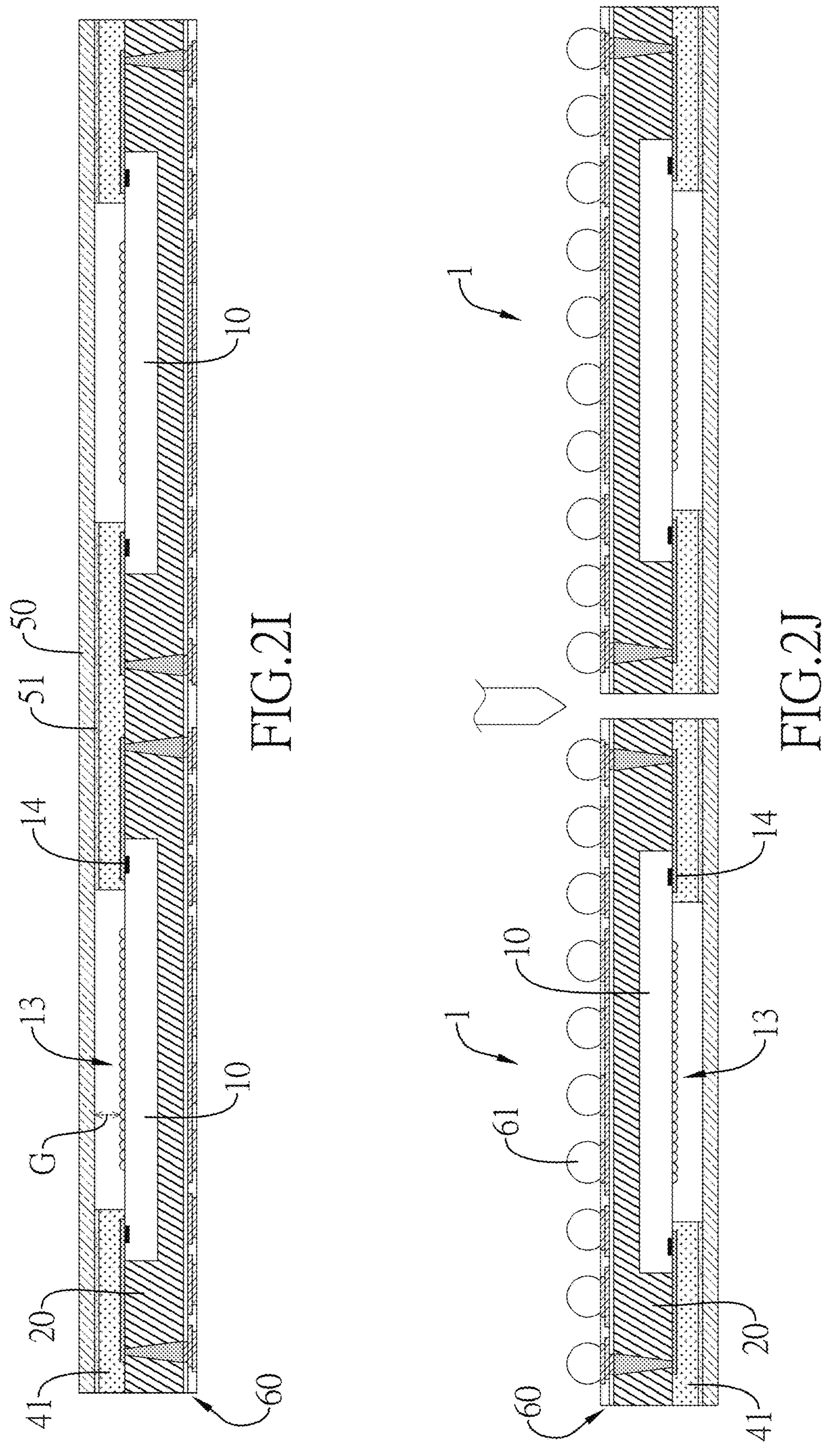

Please refer to FIG. 2I. After forming the dielectric layer 41, the photoresist layer PR is removed to expose the image sensing region 13 of each image sensing chip 10. And a transparent cover plate 50 is attached on the top surface of the dielectric layer 41, the transparent cover plate 50 is separated from the image sensing region 13 by a gap G, the height of the gap G is equivalent to the thickness of the dielectric layer 41, wherein underneath the bottom surface of the transparent cover plate 50, there is an adhesive layer 51, and the adhesive layer 51 can be used to attach to the dielectric layer 41. In this embodiment, the transparent cover plate 50 is a transparent cover, such as a glass cover or a resin cover.

Please refer to FIG. 2J. After laminating the transparent cover plate 50, a plurality of conducting terminals 61 are formed on the exterior wire redistribution layer 60, and each of the plurality of conducting terminals 61 may be in the form of a conductive solder ball or a conductive bump. In this embodiment, each of the plurality of conducting terminals 61 is formed on the exterior wire redistribution layer 60 through ball planting and reflow processes. Finally, a cutting process is performed to obtain multiple image sensors 1, and the cutting process can be realized through a blade or a laser beam.

Figure 3:
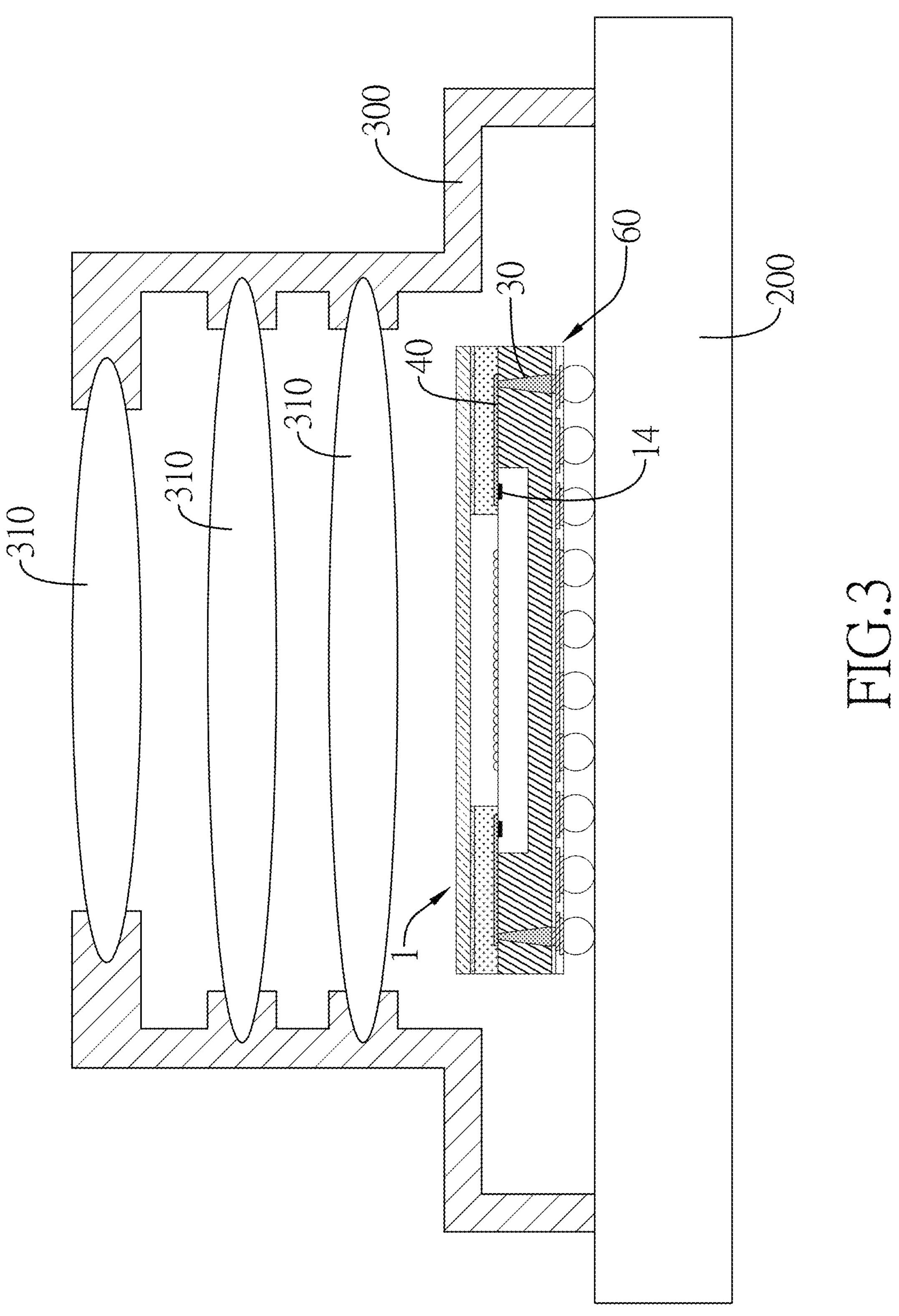
FIG. 3 is a schematic cross-sectional view of the image sensor in FIG. 1 assembled in an optical lens holder.

Please refer to FIG. 3. The image sensor 1 of the present invention does not need to use a substrate, nor does it need to form a conducting wire electrically connected to the contact pad 14 through a wire bonding process; as a result, the overall thickness of the packaged image sensor 1 can be reduced. When the image sensor 1 is assembled inside an optical lens holder 300 to form an image sensor module, the optical lens holder 300 only needs to provide a small interior space to accommodate the image sensor 1, so that the volume of the assembled image sensor module can be reduced. In addition, the image sensing chip 10 is electrically connected to the exterior wire redistribution layer 60 through the interior wire redistribution layer 40 and the conducting layer 31 in the outer-side encapsulant vias 30, and thereby signal transmission paths can be shortened and transmission impedances can be reduced.

Figure 4:
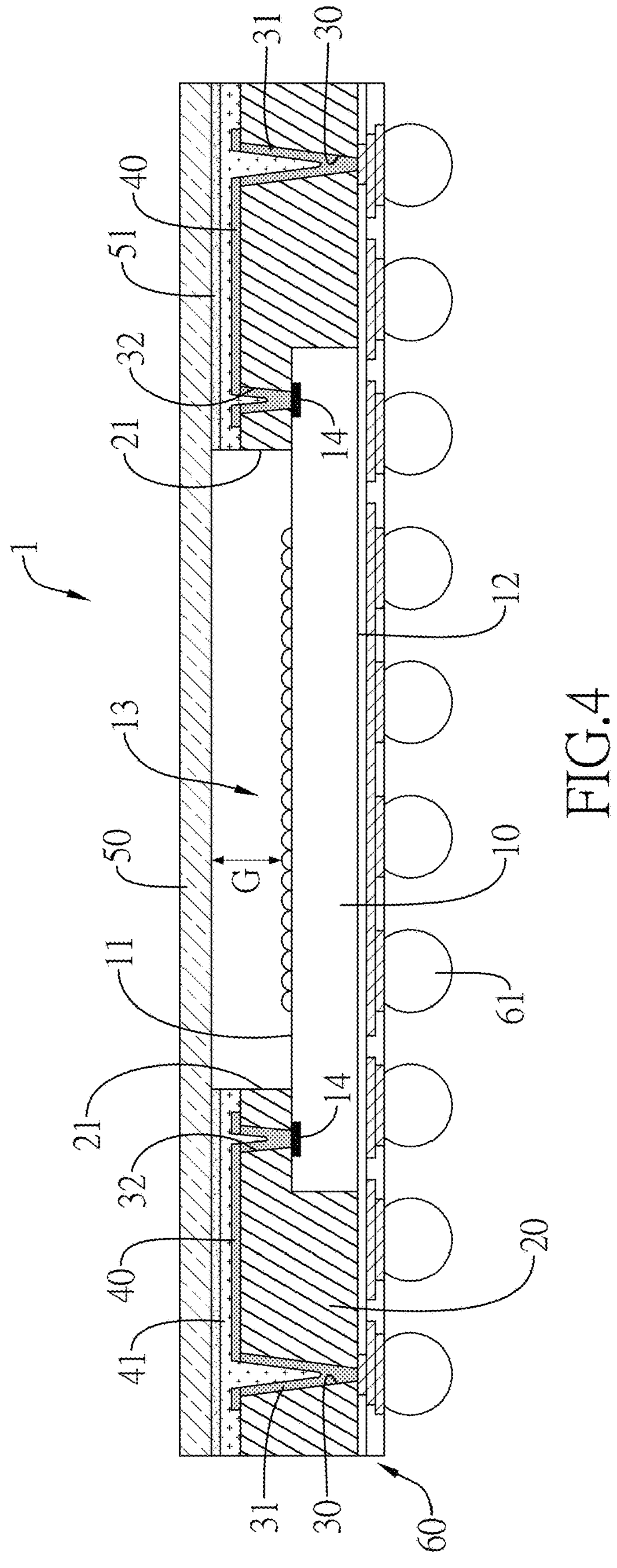
FIG. 4 is a schematic cross-sectional view of a second embodiment of the image sensor of the present invention.

Please refer to FIG. 4, which is the second embodiment of the image sensor 1 of the present invention. The main difference from the aforementioned first embodiment lies in the electrical connection structures of the contact pads 14. The encapsulant 20 wraps around the image sensing chip 10 and covers the contact pads 14 on the active surface 11 of the image sensing chip 10, and the image sensing region 13 is exposed without being covered by the encapsulant 20. The encapsulant 20 located on the active surface 11 has a sidewall 21 facing the image sensing region 13, and the sidewall 21 is directly exposed without being covered. In addition to including a plurality of outer-side encapsulant vias 30, the encapsulant 20 further includes a plurality of inner-side encapsulant vias 32, each of the plurality of inner-side encapsulant vias 32 penetrates the encapsulant 20 on the image sensing chip 10, so that each contact pad 14 is respectively exposed at one end of a corresponding inner-side encapsulant via 32.

In addition, the interior wire redistribution layer 40 is electrically connected to the conducting layer 31 of the inner-side encapsulant vias 32 and the outer-side encapsulant vias 30. A dielectric layer 41 is covered on a surface of the interior wire redistribution layer 40 and a top surface of the encapsulant 20. In this embodiment, the dielectric layer 41 fills each of the inner-side encapsulant vias 32 and each of the outer-side encapsulant vias 30. An edge of the dielectric layer 41 is flush with the sidewall 21 of the encapsulant 20 vertically.

The exterior wire redistribution layer 60 is formed on the back surface 12 of the image sensing chip 10 and the bottom surface of the encapsulant 20, and is electrically connected to the conducting layer 31 in the outer-side encapsulant vias 30. A plurality of conducting terminals 61 are electrically connected to the exterior wire redistribution layer 60, and the conducting terminals 61 serve as contacts for the image sensing chip 10 to be electrically connected to the outside. In this way, the contact pads 14 can be electrically connected to the exterior wire redistribution layer 60 through the conducting layer 31 in the inner-side encapsulant vias 32, the interior wire redistribution layer 40, and the conducting layer 31 in the outer-side encapsulant vias 30 in sequence.

The manufacturing process of the second embodiment of the image sensor 1 in FIG. 4 is described further below with reference to FIGS. 5A~5J.

Figures 5A, 5B, 5C:
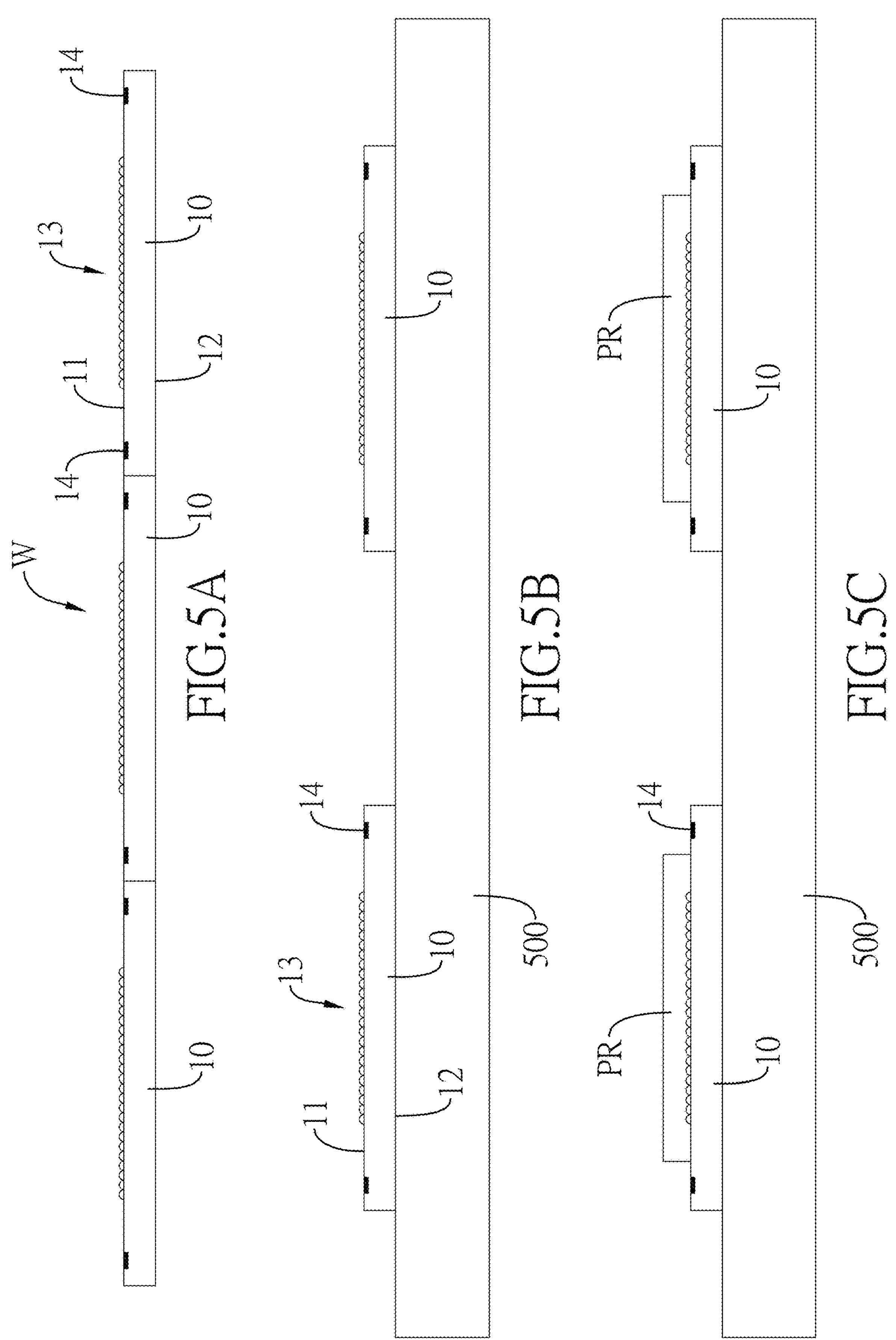
FIGS. 5A-5J are schematic diagrams of the manufacturing process of the second embodiment of the image sensor of the present invention.

Please refer to FIG. 5A: a wafer W is also provided. The wafer W is manufactured with multiple image sensing chips 10, each image sensing chip 10 has an active surface 11 and a relative back surface 12, and the active surface 11 has an image sensing region 13 and a plurality of contact pads 14 configured around a periphery of the image sensing region 13. Cutting lines are reserved between adjacent image sensing chips 10, and multiple independent image sensing chips 10 can be obtained after cutting the wafer W along these cutting lines.

Referring to FIG. 5B, each image sensing chip 10 is temporarily attached to the surface of a plate 500 at the back surface 12, so that the active surface 11 of each image sensing chip 10 faces upwards to facilitate subsequent processing, and enough spacing is reserved between adjacent image sensing chips 10 to facilitate subsequent encapsulation steps.

Please refer to FIG. 5C. A photoresist layer PR is covered on the image sensing region 13 of each image sensing chip 10. In this embodiment, the photoresist layer PR is patterned by a yellow-light process. The photoresist layer PR is used to temporarily cover the image sensing region 13 to prevent subsequent processes from affecting or polluting the image sensing region 13. The photoresist layer PR entirely covers the image sensing region 13, except the contact pads 14.

Figures 5D, 5E:
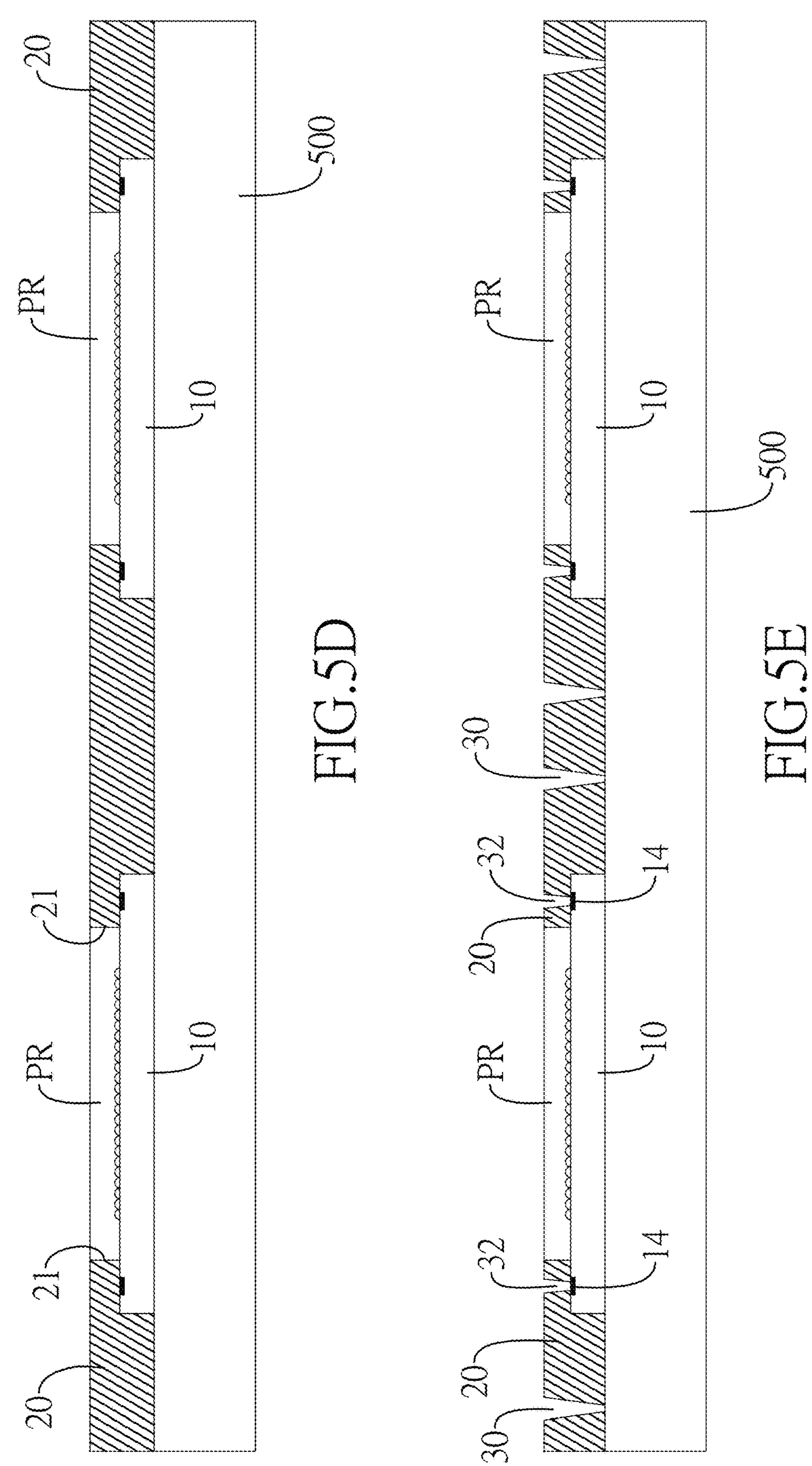

Referring to FIG. 5D, an encapsulant 20 is formed to wrap around each image sensing chip 10 and covers the contact pads 14 on the active surface 11. In this embodiment, the top surface of the encapsulant 20 is flush with the surface of the photoresist layer PR, the encapsulant 20 above the image sensing chip 10 has a sidewall 21 facing the image sensing region 13, and the sidewall 21 directly borders the photoresist layer PR. Since the surface of each image sensing region 13 is covered and protected by the photoresist layer PR, the encapsulant 20 cannot enter the image sensing region 13.

Please refer to FIG. 5E. The encapsulant 20 is drilled to obtain a plurality of encapsulant vias. In the present embodiment, laser drilling is carried out from a top surface of the encapsulant 20 downwardly to obtain encapsulant vias, and the aperture of each encapsulant via is tapered from the top surface to a bottom surface of the encapsulant 20. In other embodiments, the encapsulant vias can also be obtained by mechanically drilling the encapsulant 20 with a drill bit. According to the positions of the encapsulant vias, the encapsulant vias can be divided into inner-side encapsulant vias 32 and outer-side encapsulant vias 30, wherein the inner-side encapsulant via 32 penetrates the encapsulant 20 above the image sensing chip 10, so that a corresponding contact pad 14 on the image sensing chip 10 is exposed at one end of the inner-side encapsulant via 32; the outer-side encapsulant via 30 also penetrates the encapsulant 20, and is located on the outer periphery of the image sensing chip 10 in a direction away from the inner-side encapsulant via 32.

Figure 5F:
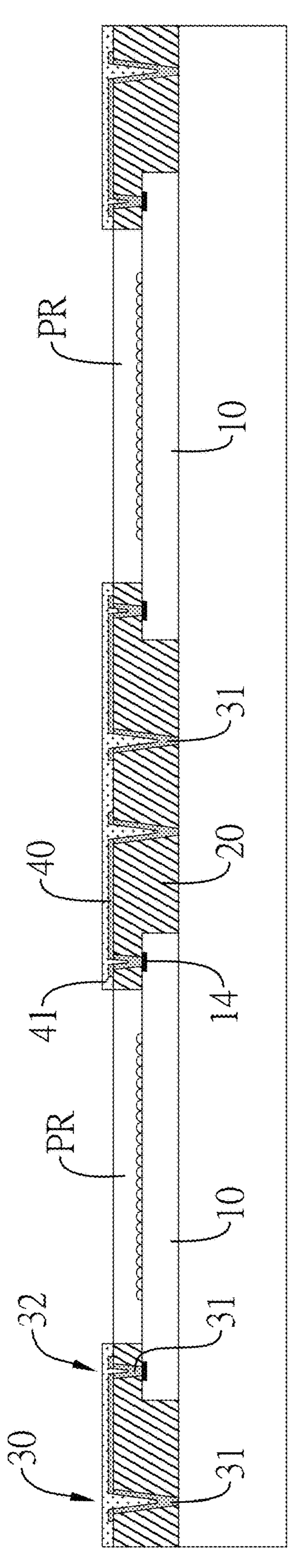

Please refer to FIG. 5F. A conducting layer 31 is covered on the inner wall of the inner-side encapsulant via 32 and the outer-side encapsulant via 30, and an interior wire redistribution layer (RDL) 40 is formed on the top surface of the encapsulant 20, and the interior wire redistribution layer 40 is electrically connected with the conducting layer 31 of the inner-side encapsulant via 32 and the conducting layer 31 of the outer-side encapsulant via 30. Therefore, the contact pad 14 can be electrically connected to the corresponding conducting layer 31 in the outer-side encapsulant via 30 through the conducting layer 31 in the inner-side encapsulant via 32.

A dielectric layer 41 is further formed on the top surface of the encapsulant 20, so that the dielectric layer 41 covers the top surface of the interior wire redistribution layer 40 and the encapsulant 20 to prevent the interior wire redistribution layer 40 from being polluted, oxidized or damaged. The dielectric layer 41 can extend to cover the encapsulant 20 above the image sensing chip 10, and the dielectric layer 41 is flush with the sidewall 21 of the encapsulant 20 vertically. In this embodiment, the dielectric layer 41 is further filled into an inside of each inner-side encapsulant via 32 and each outer-side encapsulant via 30, so as to avoid air in each inner-side encapsulant via 32 and each outer-side encapsulant via 30.

Figure 5G:
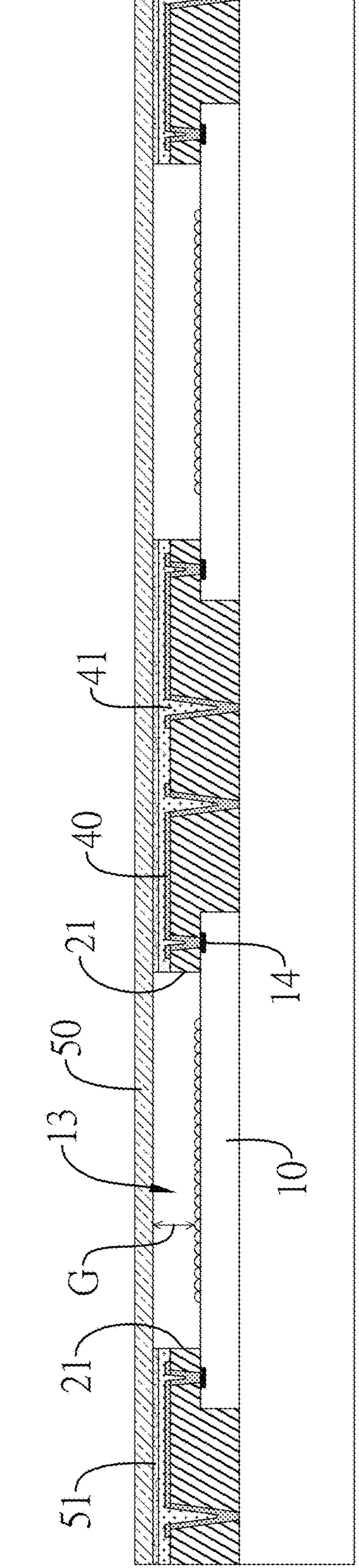

Please refer to FIG. 5G. After the dielectric layer 41 is formed, the photoresist layer PR is removed to expose the image sensing region 13, a transparent cover plate 50 is attached on the top surface of the dielectric layer 41, and the transparent cover plate 50 is separated from the image sensing region 13 by a gap G, wherein the bottom surface of the transparent cover plate 50 has an adhesive layer 51, which bonds the dielectric layer 41. In this embodiment, the transparent cover plate 50 is transparent, such as a glass cover or a resin cover.

Figures 5H, 5I:
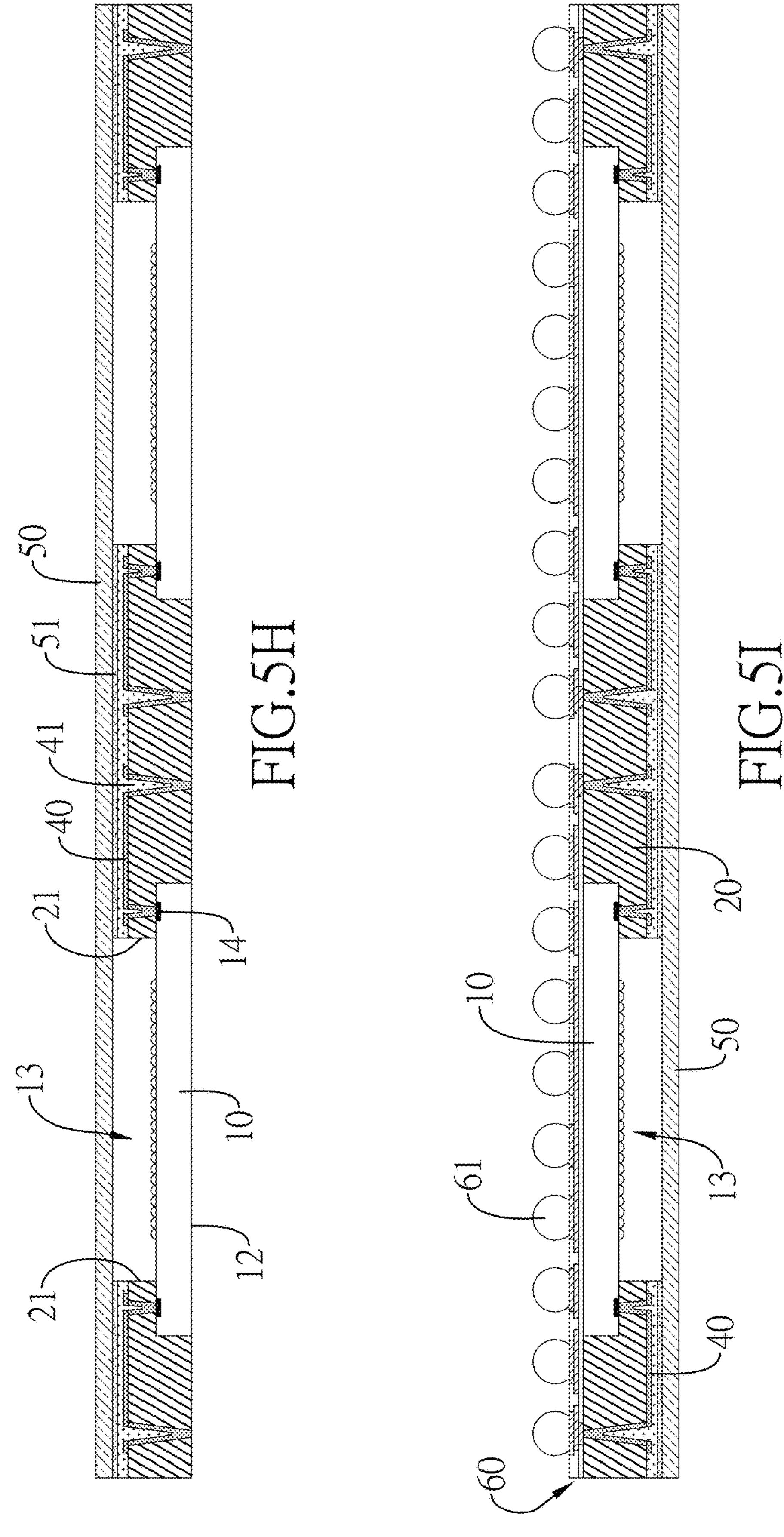

Please refer to FIG. 5H. After attaching the transparent cover plate 50, the plate 500 can be removed to expose the back surface 12 of each image sensing chip 10 and the back surface of the encapsulant 20.

Please refer to FIG. 5I. After the plate 500 is removed, each image sensing chip 10 is flipped, and an exterior wire redistribution layer 60 is formed on the back surface 12 of each image sensing chip 10, and the exterior wire redistribution layer 60 is electrically connected to the interior wire redistribution layer 40 in the outer-side encapsulant vias 30. A plurality of conducting terminals 61 are formed on the exterior wire redistribution layer 60. The conducting terminals 61 may be in the form of conductive solder balls or conductive bumps. In this embodiment, the conducting terminals 61 are formed through ball planting and reflow processes.

As explained above, the contact pad 14 is in electrical contact with the interior wire redistribution layer 40 in the inner-side encapsulant via 32, and the interior wire redistribution layer 40 is extended to the inner wall of the outer-side encapsulant vias 30 and then electrically connected to the exterior wire redistribution layer 60, so the contact pad 14 can be electrically connected to the exterior wire redistribution layer 60 and the corresponding conducting terminal 61.

Figure 5J:
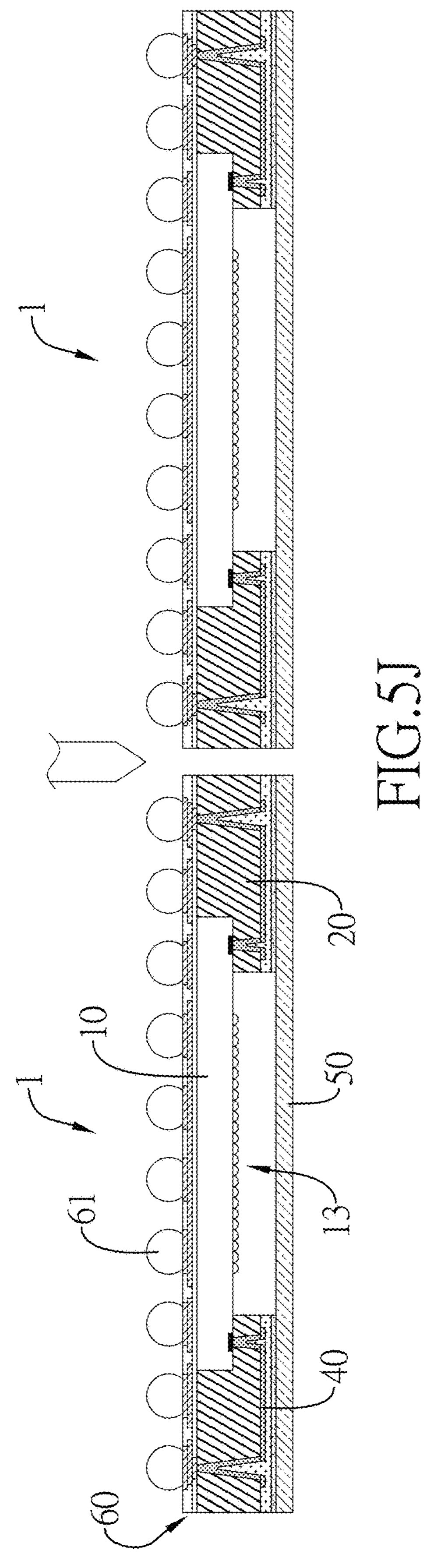

Please refer to FIG. 5J, which is a cutting process for the structure shown in FIG. 5I to obtain multiple image sensors 1. The cutting process can be realized through a blade or a laser beam.

Figure 6:
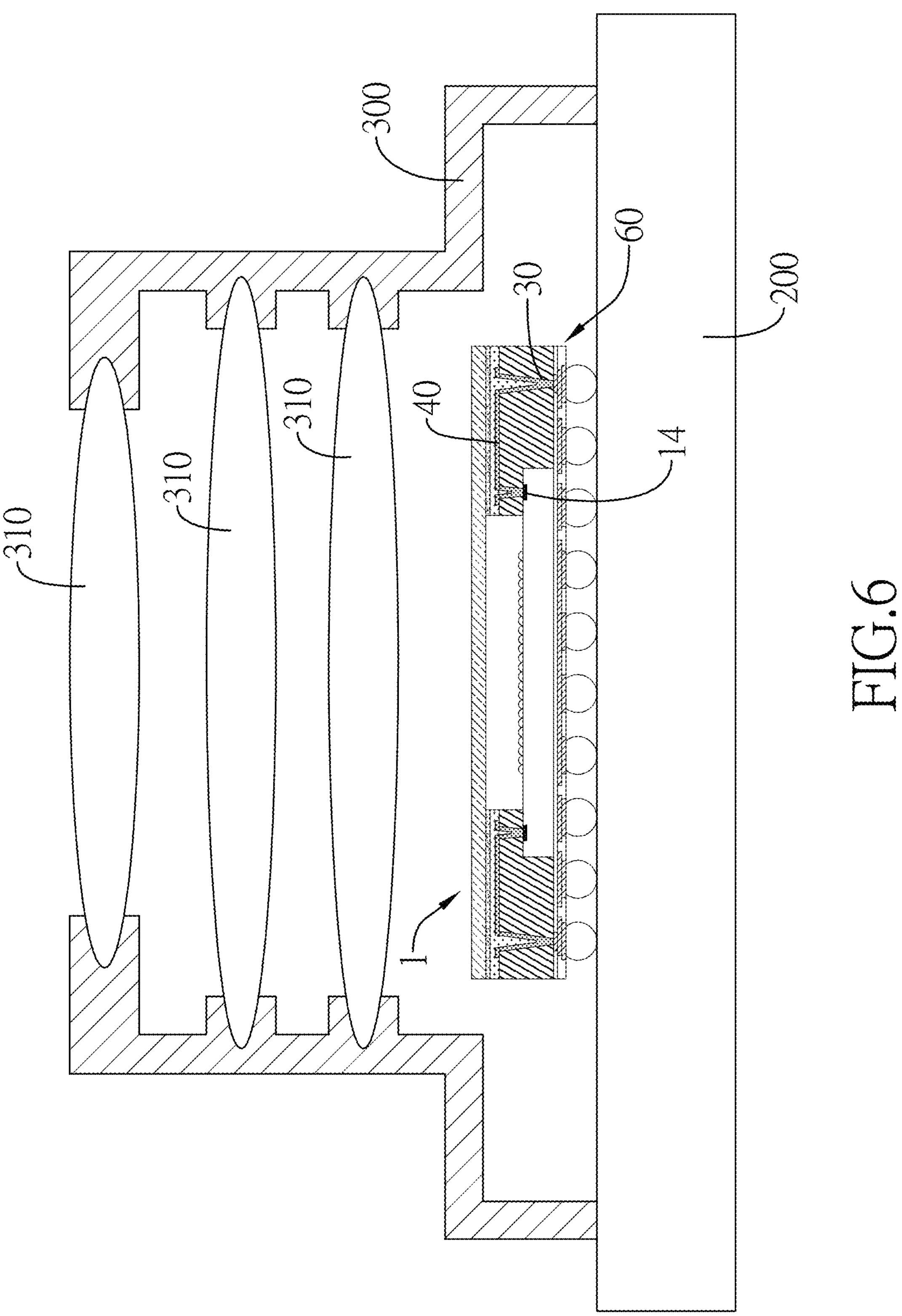
FIG. 6 is a schematic cross-sectional view of the image sensor in FIG. assembled in the optical lens holder.
Figure 7:
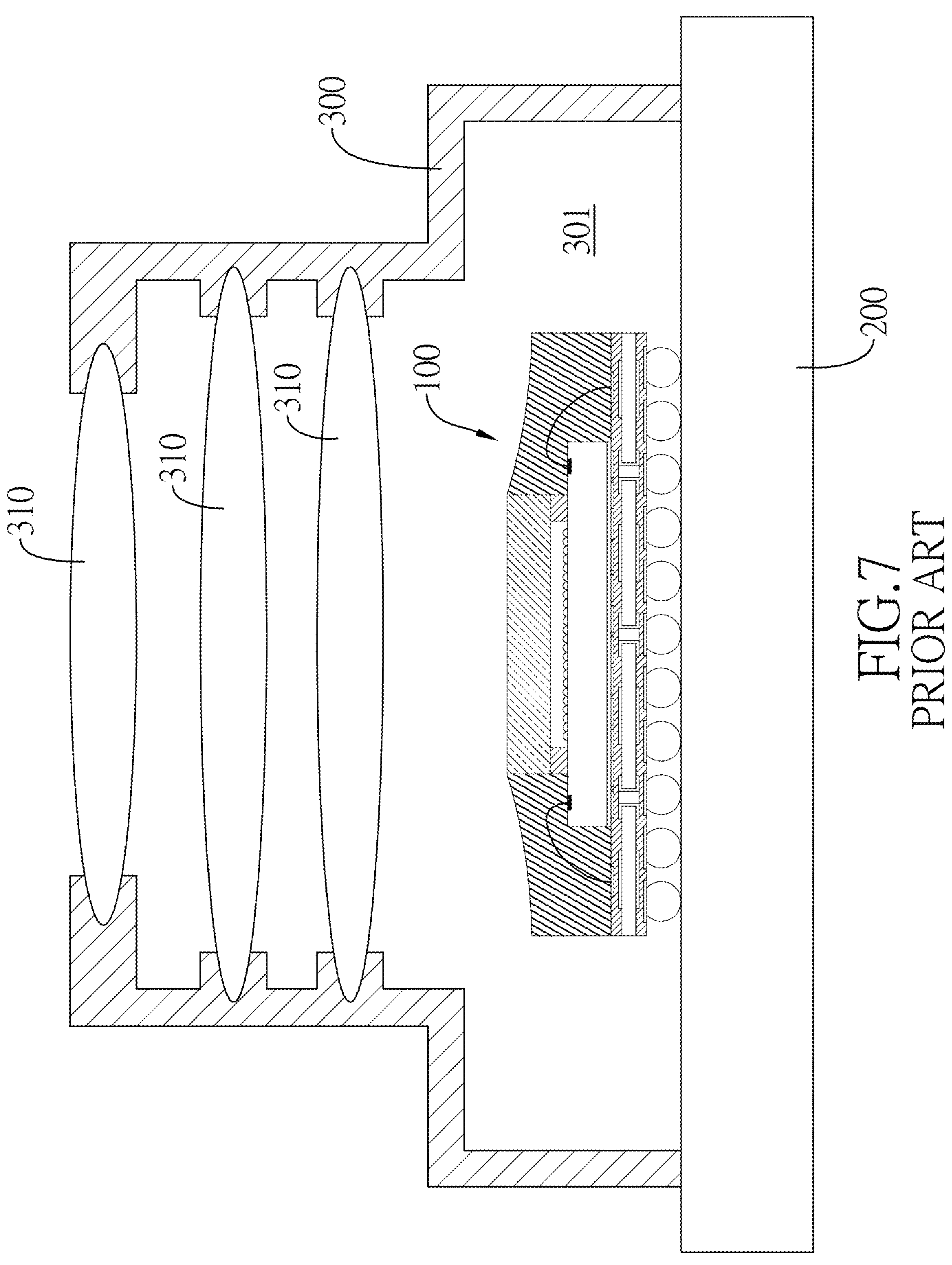
FIG. 7 is a schematic cross-sectional view of a currently available image sensor module.
Figure 8:
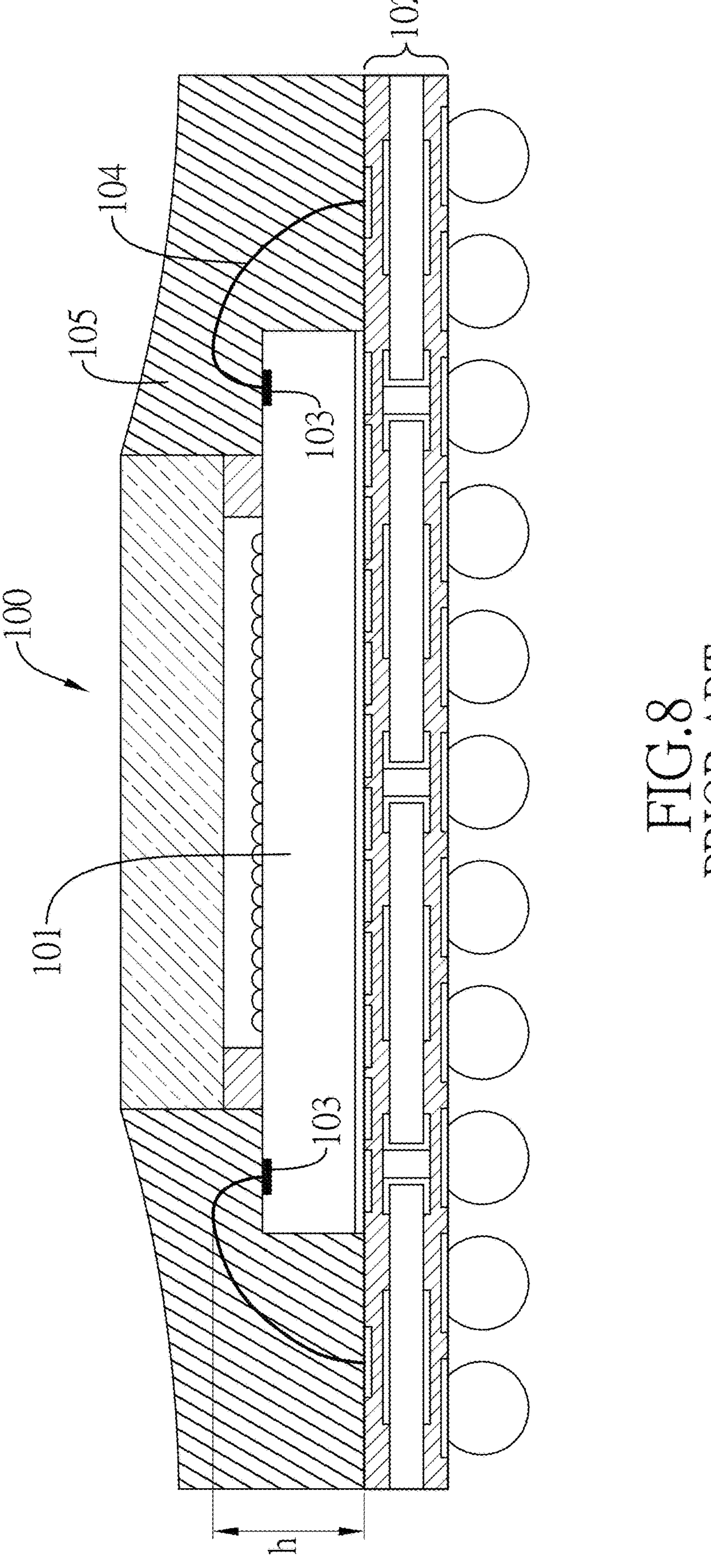
FIG. 8 is a schematic cross-sectional view of a currently available image sensor.

Please refer to FIG. 6. The second embodiment of the image sensor 1 of the present invention does not need to use a substrate, nor does it need to form a conducting wire electrically connected to the contact pad 14 through a wire bonding process; as a result, the overall thickness of the packaged image sensor 1 can be reduced. When the image sensor 1 is assembled inside an optical lens holder 300 to form an image sensing module, the optical lens holder 300 only needs to provide a small interior space for accommodating the image sensor 1, thus reducing a volume of the assembled image sensing module. The image sensing chip 10 is electrically connected to the exterior wire redistribution layer 60 through the interior wire redistribution layer 40 in the inner-side encapsulant vias 32 and the outer-side encapsulant vias 30, and thereby signal transmission paths are shortened and transmission impedances are reduced.

The aforementioned are preferred embodiments of the present invention. It should be noted that for those of ordinary skill in the art, without departing from the principles of the present invention, certain improvements and retouches of the present invention can still be made, which are nevertheless considered as within the protection scope of the present invention.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An image sensor comprising:

an image sensing chip, including an active surface and a back surface facing each other, and the active surface having an image sensing region, and a plurality of contact pads located on a periphery of the image sensing region on the active surface;

an encapsulant, wrapping around a periphery of the image sensing chip without covering the image sensing region to expose the image sensing region;

a plurality of outer-side encapsulant vias, which penetrates the encapsulant and is located on an outer periphery of the image sensing chip, and an inner wall of each of the plurality of outer-side encapsulant vias has a conducting layer;

an interior wire redistribution layer covering a top surface of the encapsulant and electrically connecting the plurality of contact pads and the conducting layer of the plurality of outer-side encapsulant vias;

a dielectric layer additionally covering a surface of the interior wire redistribution layer and the top surface of the encapsulant, and the dielectric layer directly covering the periphery of the image sensing region of the active surface without covering the image sensing region of the active surface, wherein the dielectric layer and the interior wire redistribution layer are two separately formed layers;

a transparent cover plate, attached to the top surface of the dielectric layer through an adhesive layer, and separated from the image sensing region by a gap;

an exterior wire redistribution layer formed underneath the image sensing chip and a bottom surface of the encapsulant, and the exterior wire redistribution layer electrically connected to the conducting layer of the plurality of outer-side encapsulant vias; and a plurality of conducting terminals, electrically connected to the exterior wire redistribution layer.

2. The image sensor as claimed in claim 1, wherein the top surface of the encapsulant is flush with the active surface of the image sensing chip.

3. The image sensor as claimed in claim 1, wherein the encapsulant further wraps the back surface of the image sensing chip, and the exterior wire redistribution layer is formed entirely on the bottom surface of the encapsulant.

4. The image sensor as claimed in claim 1, wherein the height of the gap is equal to the thickness of the dielectric layer.

5. The image sensor as claimed in claim 1, wherein the interior wire redistribution layer extends horizontally to the active surface to electrically connect the plurality of contact pads; the dielectric layer directly covers a periphery of the active surface.

6. The image sensor as claimed in claim 1, wherein an aperture of each of the plurality of outer-side encapsulant vias is tapered from the bottom surface to the top surface of the encapsulant; the conducting layer is filled into the plurality of outer-side encapsulant vias.

7. An image sensor, comprising:

an image sensing chip, including an active surface and a back surface facing each other, and the active surface having an image sensing region, and a plurality of contact pads located on a periphery of the image sensing region on the active surface;

an encapsulant, wrapping around a periphery of the image sensing chip without covering the image sensing region to expose the image sensing region;

a plurality of outer-side encapsulant vias, which penetrates the encapsulant and is located on an outer periphery of the image sensing chip, and an inner wall of each of the plurality of outer-side encapsulant vias has a conducting layer;

an interior wire redistribution layer covering a top surface of the encapsulant and electrically connecting the plurality of contact pads and the conducting layer of the plurality of outer-side encapsulant vias;

a dielectric layer covering a surface of the interior wire redistribution layer and the top surface of the encapsulant;

a transparent cover plate, attached to the top surface of the dielectric layer through an adhesive layer, and separated from the image sensing region by a gap;

an exterior wire redistribution layer formed underneath the image sensing chip and a bottom surface of the encapsulant, and the exterior wire redistribution layer electrically connected to the conducting layer of the plurality of outer-side encapsulant vias; and a plurality of conducting terminals, electrically connected to the exterior wire redistribution layer;

wherein, the back surface of the image sensing chip is exposed without being covered by the encapsulant; the encapsulant further covers the plurality of contact pads on the active surface;

the encapsulant further includes a plurality of inner-side encapsulant vias; each of the plurality of inner-side encapsulant vias penetrates the encapsulant located on the image sensing chip, and each of the plurality of contact pads is respectively exposed at one end of a corresponding inner-side encapsulant via of the plurality of inner-side encapsulant vias;

wherein, the dielectric layer is filled into each of the plurality of inner-side encapsulant vias and each of the plurality of outer-side encapsulant vias;

an inner wall of each of the plurality of inner-side encapsulant vias has a conducting layer which is electrically connected to the interior wire redistribution layer and a contact pad of the plurality of contact pads.

8. The image sensor as claimed in claim 7, wherein the exterior wire redistribution layer is formed on the bottom surface of the encapsulant and the back surface of the image sensing chip.

9. The image sensor as claimed in claim 7, wherein the encapsulant on the active surface has a sidewall facing the gap between the transparent cover plate and the image sensing region, and the sidewall is flush with a surface of the dielectric layer facing the gap, along a direction perpendicular to the active surface, and the image sensing region is directly exposed without being covered by the encapsulant.

10. The image sensor as claimed in claim 7, wherein the apertures of each of the plurality of inner-side encapsulant vias and each of the plurality of outer-side encapsulant vias are tapered from the top surface toward the bottom surface of the encapsulant.

* * * * *